United States Patent [19]

Dixon, Jr. et al.

[11] Patent Number: 4,654,609
[45] Date of Patent: Mar. 31, 1987

[54] MONOLITHIC PLANAR DOPED BARRIER LIMITER

[75] Inventors: Samuel Dixon, Jr., Neptune; Thomas R. AuCoin, Ocean; Roger J. Malik, Summit, all of N.J.

[73] Assignee: The United States of America as represented by the Secretary of the Army, Washington, D.C.

[21] Appl. No.: 705,267

[22] Filed: Feb. 25, 1985

[51] Int. Cl.[4] ............................................. H01P 1/22
[52] U.S. Cl. .................................. 333/17 L; 333/250
[58] Field of Search ...................... 333/17 L, 247, 250

[56] References Cited

U.S. PATENT DOCUMENTS

| | | | |
|---|---|---|---|
| 3,944,950 | 3/1976 | Jacobs et al. | 333/250 X |
| 4,344,047 | 8/1982 | Dixon, Jr. | 333/17 L |
| 4,410,902 | 10/1983 | Malik . | |
| 4,563,773 | 1/1986 | Dixon, Jr. et al. | 455/327 |

*Primary Examiner*—Paul Gensler
*Attorney, Agent, or Firm*—Sheldon Kanars; Jeremiah G. Murray; John T. Rehberg

[57] ABSTRACT

A passive millimeter wave image guide power limiter comprising a length of dielectric transmission line or waveguide for millimeter wave frequencies located on a relatively thin conductive ground plane forming thereby an image guide and including a planar doped barrier diode structure formed in the dielectric transmission line with the planar doped barrier structure being integrally grown in a slot milled in the constituent material, i.e. gallium arsenide, of the waveguide transversely across the width dimension thereof so as to be oriented perpendicular to the flow of RF power being propagated along its length dimension. The planar doped barrier structure becomes conductive at a predetermined power level to reflect any further incident RF power back toward the power source.

4 Claims, 6 Drawing Figures

MONOLITHIC PLANAR DOPED BARRIER LIMITER

The invention described herein may be manufactured, used and licensed by or for the Government for governmental purposes without the payment of any royalties thereon or therefor.

CROSS REFERENCE TO RELATED APPLICATIONS

This application is related to:

U.S. Ser. No. 581,833, entitled, "Millimeter Wave Signal Limiter", filed in the name of Samuel Dixon, Jr. on Feb. 21, 1984, now U.S. Pat. No. 4,511,865; and U.S. Ser. No. 588,612, entitled, "Monolithic Planar Doped Barrier Subharmonic Mixer", filed in the names of Samuel Dixon, Jr. and Roger J. Malik on Mar. 12, 1984, now U.S. Pat. No. 4,563,773.

The teachings of both of these related applications are meant to be specifically incorporated herein by reference.

FIELD OF THE INVENTION

This invention relates generally to signal limiters and more particularly to millimeter wave monolithic dielectric waveguide power limiters.

BACKGROUND OF THE INVENTION

Most low frequency power limiting devices presently known in the state of the art are fabricated around a nonlinear element, generally a ferrite element or diode, in a coaxial or waveguide structure.

At millimeter wavelengths and submillimeter wavelengths, however, the techniques and components used in the microwave region are inapplicable due to the relatively high power losses and the high cost. For this reason, the state of the art has turned to employing a dielectric transmission medium located on a conductive ground plane which forms thereby an image guide transmission line structure. The dielectric transmission medium typically comprises a high resistivity material such as gallium arsenide (GaAs) which is adapted to propagate the signals through the submillimeter frequency region with relatively little loss.

In the above referenced related application entitled, "Millimeter Wave Signal Limiter", there is disclosed a power limiter comprised of a high resistivity dielectric transmission line located on a conductive ground plane and having a plurality of slots formed in the transmission line at predetermined spaced intervals with the slots each containing a small rectangular block of high anisotropic uniaxial barrium ferrite. A biasing DC magnetic field is transversely applied across the ferrite bodies by means of a pair of rare earth permanent magnets located at the sides of the dielectric transmission line and ground plane. The magnetic field applied to the ferrite bodies causes magnetic moments in the ferrite material to precess at a rate determined by the strength of the biasing magnetic field whereby, at a critical threshold level of power coupled to and propagating down the transmission line, spin waves are generated in the ferrite material to absorb signal energy and thus limit the power coupled out of the transmission line to the threshold level.

In the other related application entitled, "Monolithic Planar Doped Barrier Subharmonic Mixer", there is disclosed a monolithic signal mixer for millimeter wave and submillimeter wave signals and employing a semiconductor planar doped barrier diode structure formed on a dielectric (GaAs) transmission line and being of the type shown in disclosed in U.S. Pat. No. 4,410,902, entitled, "Planar Doped Barrier Semiconductor Device", which issued to Roger J. Malik, on Oct. 18, 1983. Disclosed in the Malik patent is a device fabricated in GaAs which comprises a n+-i-p+-i-n+ structure wherein an extremely narrow p+ planar region is positioned between adjoining regions of intrinsic semiconductor material.

Accordingly, it is an object of the present invention to provide an improvement in millimeter wave devices.

It is another object of the invention to provide a millimeter wave device in the form of a power limiter.

It is a further object of the invention to provide a monolithic planar doped barrier power limiter which operates at millimeter wave and submillimeter wave frequencies.

It is yet another object of the invention to provide a passive millimeter wave power limiter for the front end section of a millimeter wave signal receiver.

SUMMARY

Briefly, the foregoing and other objects of the invention are directed to a means for controlling the power level impinging on a sensitive portion of an electronic system such as the mixer stage incorporated in the front-end of a millimeter wave signal receiver operating in a relatively high power signal environment and which requires the mixer stage, for example, to be protected from high average power emitters in close proximity. The invention is comprised of a passive planar doped barrier diode structure grown as an integral part of a dielectric waveguide located on a conductive ground plane which forms thereby an image guide transmission line structure. The planar doped barrier diode structure is located across the width dimension of the dielectric transmission line between an RF power source and the circuitry to be protected and is formed by opening up a uniform slot in the semi-insulating material, typically gallium arsenide, of the dielectric waveguide and by utilizing molecular beam epitaxy techniques, growing a planar doped barrier diode structure having an n+-i-p+-i-n+ configuration wherein there is an extremely narrow p+ planar doped acceptor region positioned between a pair of nominally undoped regions bounded by two heavily doped donor regions. The planar doped barrier diode structure operates to pass RF signals below a predetermined threshold level but thereafter becomes conductive and in doing so introduces a transmission line mismatch causing RF energy to be reflected back down the line.

BRIEF DESCRIPTION OF THE DRAWINGS

While the present invention is defined in the claims annexed to and forming a part of this specification, a better understanding can be had by reference to the following description when taken in conjunction with the accompanying drawings in which:

DESCRIPTION OF THE PREFERRED EMBODIMENT

Shown and described herein is a millimeter wave device that utilizes a planar doped barrier (PDB) structure integrated into the transmission medium of an image type transmission line for limiting the power being propagated therealong and operates as a switch for permitting relatively low power to propagate past the structure but reflects substantially all power above a certain predetermined threshold level.

Figure 1:
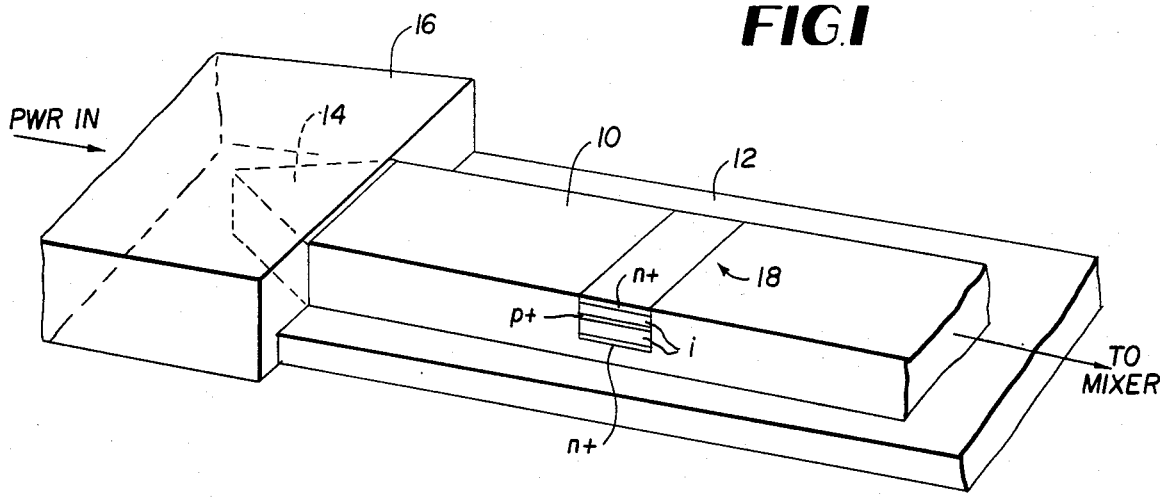
FIG. 1 is a perspective view of a millimeter wave power limiter in accordance with the preferred embodiment of the invention.

Referring now to the drawings and more particularly to FIG. 1, shown therein is a passive monolithic dielectric waveguide power limiter in accordance with the preferred embodiment of the invention. As shown, reference numeral 10 denotes an elongated dielectric waveguide member having a generally rectangular cross section. The dielectric waveguide 10 is comprised of material having a relatively high dielectric constant and resistivity and typically comprises a semiconductor group III-V compound of which gallium arsenide (GaAs) is a member and constitutes the preferred material. The waveguide member 10 is further located on a relatively thin co-extensive conductive ground plane 12 and is contiguous therewith so that an image waveguide transmission line structure is provided for the propagation of millimeter wave and submillimeter wave signals. The dielectric waveguide member 10 terminates in a tapered end section 14 which extends into a metal to dielectric waveguide transition section 16. The transition section 16 couples to an input source of power, not shown, comprising a signal, for example, in the 60 to 300 GHz frequency range. The opposite end of the dielectric waveguide member is coupled, for example, to the mixer stage, not shown, of a millimeter wave signal receiver or other device(s) which is sensitive to millimeter waves being propagated along the waveguide member 10.

Figure 2A:
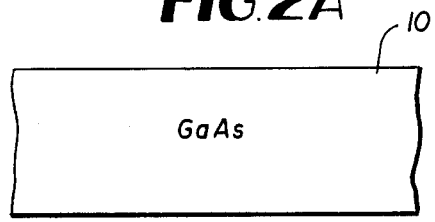
FIGS. 2A, 2B and 2C comprise partial side planar views illustrative of the fabrication steps utilized in constructing the embodiment of the invention shown in FIG. 1.
Figure 2B:
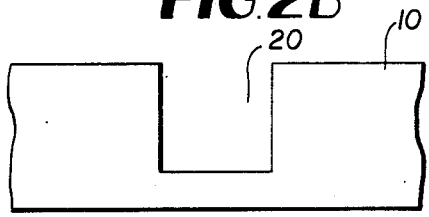

In order to protect the relatively fragile mixer stage, for example, of a monolithic planar transmitter-receiver, not shown, operating in a high power signal environment from high power sources, the present invention has for its objective the location of a power limiter device 18 in the transmission line upstream of the device being protected. The power limiter device 18 comprises a planar doped barrier structure integrated into the same material (GaAs) from which the dielectric waveguide 10 is formed. The PDB structure 18 comprises a diode structure formed transversely across the waveguide member 10 so that it spans the entire width of the waveguide member and constitutes an n+-i-p+-i-n+ semiconductor device such as disclosed in the above referenced Malik patent, i.e., U.S. Pat. No. 4,410,902. As further shown in FIGS. 2A through 2C, a section of generally rectangular cross section is milled out of the dielectric waveguide member 10 to a predetermined depth followed by a growing of the planar doped barrier structure 18 in the resulting slot. A generally uniform transverse slot 20 is constructed, for example, by using well known ion beam milling techniques while the growth technique for fabricating the PDB structure 18 comprises the well known process of molecular beam epitaxy which involves the use of selected molecular beams for condensation on a heated substrate in an ultra high vacuum environment. Due to the relatively slow growth rate and low substrate temperature, very precise epilayer thicknesses and abrupt doping profiles can be obtained.

Figure 2C:
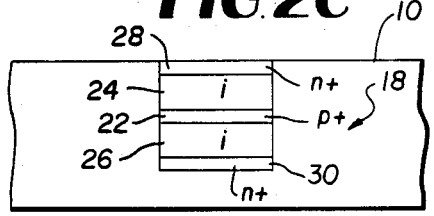
Figure 3:
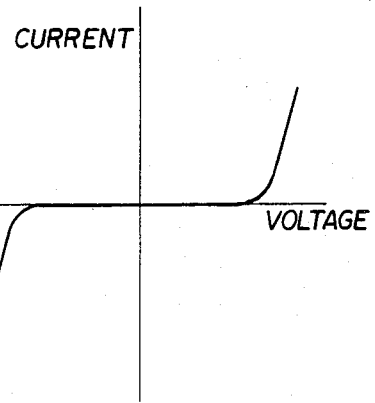
FIG. 3 is a graph illustrative of the current-voltage characteristic of the planar doped barrier device of the subject invention.

Accordingly, the PDB structure 18 is grown by the selective deposition of suitably doped gallium arsenide having a profile as shown in FIG. 2C, and which comprises a relatively narrow highly doped p+ planar region 22 located within intrinsic or nominally undoped regions 24 and 26 consisting of upper and lower contiguous i planar regions bordered respectively by a highly doped n+ surface and buffer planar regions 28 and 30. The respective widths of the undoped or intrinsic regions 24 and 26 and the high densities of the ionized impurities within the space charge region 22 results in rectangular and triangular electric fields and potential barriers, respectively being formed as taught in U.S. Pat. No. 4,410,902. Independent and continuous control of the barrier height and the asymmetry of the current vs. voltage characteristic as shown in FIG. 3 is provided through variation of the acceptor charge density, the widths of the undoped regions 24 and 26.

Figure 4:
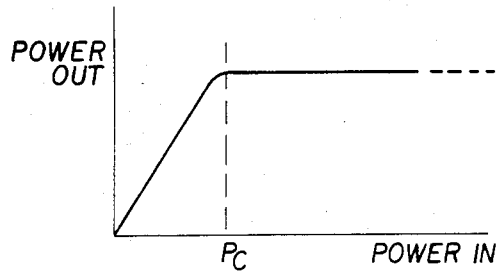
FIG. 4 is a graph illustrative of the power limiter characteristic of the embodiment of the invention shown in FIG. 1.

In operation, when input signal power is coupled to the high resistivity GaAs waveguide member 10, as shown in FIG. 1, it will propagate through the planar doped barrier device 18 which operates as a diode with little loss as long as the power level is below a certain critical value $P_c$ as shown in FIG. 4. When the signal voltage and accordingly the input power exceeds the threshold level $P_c$, a current will flow in the PDB diode 18 causing any further input power to be reflected back toward the RF source. This results due to the fact that current flow in the PDB diode 18 decreases the impedance in the planar doped barrier region which causes an impedance mismatch with the result that power reflection and hence limiting action takes place. Thus any sensitive devices downstream of the PDB limiter diode structure 18 will be protected from undesirable high power levels which would otherwise be applied thereto.

Thus what has been shown and described is a millimeter wave passive device in the form of a monolithic dielectric waveguide power limiter capable of operating over a minimum of 30 dB dynamic range and which additionally functions as a millimeter wave signal stabilizer particularly adapted for integrated circuit receiver front-end sections of millimeter wave and submillimeter wave apparatus including radar and communications systems.

While there has been shown and described what is at present considered to be the preferred embodiment of the invention, it is noted that the same has been made by way of illustration and not limitation. Accordingly, all modifications, alterations and changes coming within the spirit and scope of the invention as set forth in the appended claims are herein meant to be included.

We claim:

1. A planar doped barrier power limiter for millimeter and submillimeter waves, comprising:
   a dielectric transmission line having a relatively high resistivity;
   a conductive ground plane upon which said dielectric transmission line is located, thereby forming an image line structure;
   said dielectric transmission line including a slot of predetermined depth traversing the width dimension of said dielectric transmission line, said slot having three sides, and further including a planar doped barrier structure fitting closely within said slot and being in contact with said transmission line along all three sides of said slot, said transmission line permitting power below a predetermined threshold level to propagate along the length dimension of said line past said planar doped barrier structure, but reflecting substantially all power above said predetermined threshold level.

2. A power limiter as defined by claim 1 wherein said planar doped barrier structure includes an n+-i-p+-i-n+ epilayered semiconductor structure.

3. The power limiter as defined by claim 1 wherein said dielectric transmission line is fabricated from a Group III-V compound.

4. The power limiter as defined by claim 1 wherein said dielectric transmission line is fabricated from gallium arsenide.

* * * * *